United States Patent
Brazis, Jr.

(10) Patent No.: US 9,869,719 B2
(45) Date of Patent: *Jan. 16, 2018

(54) HIGH SPEED CONTROLLABLE LOAD

(71) Applicant: UL LLC, Northbrook, IL (US)

(72) Inventor: Paul W. Brazis, Jr., South Elgin, IL (US)

(73) Assignee: UL LLC, Northbrook, IL (US)

(*) Notice: Subject to any disclaimer, the term of this patent is extended or adjusted under 35 U.S.C. 154(b) by 0 days.

This patent is subject to a terminal disclaimer.

(21) Appl. No.: 15/383,233

(22) Filed: Dec. 19, 2016

(65) Prior Publication Data

US 2017/0097391 A1    Apr. 6, 2017

Related U.S. Application Data

(63) Continuation of application No. 13/160,710, filed on Jun. 15, 2011, now Pat. No. 9,551,751.

(51) Int. Cl.
G01R 31/02    (2006.01)
G01R 31/327   (2006.01)

(52) U.S. Cl.
CPC ................. *G01R 31/3274* (2013.01)

(58) Field of Classification Search
CPC .......... G01R 31/2834; G01R 31/327; G01R 31/333; G01R 31/14; G01R 31/2851; G01R 31/1272; G01R 31/3333; G01R 31/002
USPC ........ 324/750.01, 424, 536, 409, 678, 76.34
See application file for complete search history.

(56) References Cited

U.S. PATENT DOCUMENTS

| | | | |
|---|---|---|---|
| 735,234 A * | 8/1903 | Mernyk | B02C 2/10 241/258 |
| 795,458 A * | 7/1905 | Kolker | B65D 1/0223 215/383 |
| 3,515,943 A | 6/1970 | Van Cortlandt | |
| 3,588,611 A | 6/1971 | Lambden et al. | |
| 3,746,930 A | 7/1973 | Van Best et al. | |
| 3,878,460 A | 4/1975 | Nimmersjo | |
| 3,914,667 A | 10/1975 | Waldron | |

(Continued)

FOREIGN PATENT DOCUMENTS

| | | |
|---|---|---|
| CN | 1696723 A | 11/2005 |
| DE | 2653704 B1 | 12/1977 |

(Continued)

OTHER PUBLICATIONS

International Search Report and Written Opinion for International Application No. PCT/US2011/040611 dated Mar. 16, 2012.

(Continued)

*Primary Examiner* — Jermele M Hollington
*Assistant Examiner* — Taqi Nasir
(74) *Attorney, Agent, or Firm* — Marshall, Gerstein & Borun LLP

(57) ABSTRACT

A high speed controllable load uses a voltage waveform synthesizer and a driver circuit to dynamically control an electronically variable load to generate a current though an arc fault circuit interrupter (AFCI) device under test. Sensors may be used to monitor a source voltage and the output current to generate an arbitrary waveform have a range of voltage and current phase shifts. An optical isolation circuit allows separation of grounds between a control stage and the AFCI device under test.

20 Claims, 8 Drawing Sheets

(56) References Cited

U.S. PATENT DOCUMENTS

| | | | |
|---|---|---|---|
| 4,466,071 A | 8/1984 | Russell, Jr. |
| 4,658,322 A | 4/1987 | Rivera |
| 4,697,218 A | 9/1987 | Nicolas |
| 4,853,818 A | 8/1989 | Emery et al. |
| 4,858,054 A | 8/1989 | Franklin |
| 4,922,368 A | 5/1990 | Johns |
| 4,931,894 A | 6/1990 | Legatti |
| 4,949,214 A | 8/1990 | Spencer |
| 5,185,684 A | 2/1993 | Beihoff et al. |
| 5,185,687 A | 2/1993 | Beihoff et al. |
| 5,208,542 A | 5/1993 | Tennies et al. |
| 5,224,006 A | 6/1993 | MacKenzie et al. |
| 5,280,404 A | 1/1994 | Ragsdale |
| 5,359,293 A | 10/1994 | Boksiner et al. |
| 5,432,455 A | 7/1995 | Blades |
| 5,452,223 A | 9/1995 | Zuercher et al. |
| 5,459,630 A | 10/1995 | MacKenzie et al. |
| 5,477,150 A | 12/1995 | Ham, Jr. et al. |
| 5,561,605 A | 10/1996 | Zuercher et al. |
| 5,590,012 A | 12/1996 | Dollar, II |
| 5,642,300 A | 6/1997 | Gubisch et al. |
| 5,657,244 A | 8/1997 | Seitz |
| 5,691,869 A | 11/1997 | Engel et al. |
| 5,706,159 A | 1/1998 | Dollar, II et al. |
| 5,726,577 A | 3/1998 | Engel et al. |
| 5,729,145 A | 3/1998 | Blades |
| 5,818,237 A | 10/1998 | Zuercher et al. |
| 5,834,940 A | 11/1998 | Brooks et al. |
| 5,839,092 A | 11/1998 | Erger et al. |
| 5,864,110 A | 1/1999 | Moriguchi et al. |
| 5,933,305 A | 8/1999 | Schmalz et al. |
| 5,946,179 A | 8/1999 | Fleege et al. |
| 5,963,406 A | 10/1999 | Neiger et al. |
| 5,969,920 A | 10/1999 | Mackenzie |
| 5,982,593 A | 11/1999 | Kimblin et al. |
| 6,031,699 A | 2/2000 | Dollar, II et al. |
| 6,052,265 A | 4/2000 | Zaretsky et al. |
| 6,072,317 A | 6/2000 | Mackenzie |
| 6,084,756 A | 7/2000 | Doring et al. |
| 6,088,205 A | 7/2000 | Neiger et al. |
| 6,128,169 A | 10/2000 | Neiger et al. |
| 6,141,192 A | 10/2000 | Garzon |
| 6,191,589 B1 | 2/2001 | Clunn |
| 6,195,241 B1 | 2/2001 | Brooks et al. |
| 6,195,243 B1 | 2/2001 | Spencer et al. |
| 6,198,830 B1 | 3/2001 | Holube et al. |
| 6,212,049 B1 | 4/2001 | Spencer et al. |
| 6,215,378 B1 | 4/2001 | Gibson et al. |
| 6,218,844 B1 | 4/2001 | Wong et al. |
| 6,229,679 B1 | 5/2001 | Macbeth |
| 6,233,128 B1 | 5/2001 | Spencer et al. |
| 6,242,922 B1 | 6/2001 | Daum et al. |
| 6,242,993 B1 | 6/2001 | Fleege et al. |
| 6,246,556 B1 | 6/2001 | Haun et al. |
| 6,255,923 B1 | 7/2001 | Mason, Jr. et al. |
| 6,259,340 B1 | 7/2001 | Fuhr et al. |
| 6,259,996 B1 | 7/2001 | Haun et al. |
| 6,262,871 B1 | 7/2001 | Nemir et al. |
| 6,266,219 B1 | 7/2001 | Macbeth et al. |
| 6,275,044 B1 | 8/2001 | Scott |
| 6,285,534 B1 | 9/2001 | Gibson et al. |
| 6,288,882 B1 | 9/2001 | DiSalvo et al. |
| 6,292,347 B1 | 9/2001 | Bremond et al. |
| 6,309,248 B1 | 10/2001 | King |
| 6,313,641 B1 | 11/2001 | Brooks |
| 6,313,642 B1 | 11/2001 | Brooks |
| 6,339,525 B1 | 1/2002 | Neiger et al. |
| 6,362,629 B1 | 3/2002 | Parker et al. |
| 6,370,001 B1 | 4/2002 | Macbeth |
| 6,373,257 B1 | 4/2002 | Macbeth et al. |
| 6,377,055 B1 | 4/2002 | Macbeth et al. |
| 6,377,427 B1 | 4/2002 | Haun et al. |
| 6,392,513 B1 | 5/2002 | Whipple et al. |
| 6,400,258 B1 | 6/2002 | Parker |
| 6,407,893 B1 | 6/2002 | Neiger et al. |
| 6,414,829 B1 | 7/2002 | Haun et al. |
| 6,417,671 B1 | 7/2002 | Tiemann |
| 6,421,214 B1 | 7/2002 | Packard et al. |
| 6,426,632 B1 * | 7/2002 | Clunn .................. G01R 15/183 324/424 |
| 6,426,634 B1 | 7/2002 | Clunn et al. |
| 6,433,977 B1 | 8/2002 | Macbeth |
| 6,433,978 B1 | 8/2002 | Neiger et al. |
| 6,456,471 B1 | 9/2002 | Haun et al. |
| 6,459,273 B1 | 10/2002 | Dollar, II et al. |
| 6,462,560 B1 | 10/2002 | Rezvani |
| 6,466,029 B2 | 10/2002 | Stroth et al. |
| 6,477,021 B1 | 11/2002 | Haun et al. |
| 6,504,692 B1 | 1/2003 | Macbeth et al. |
| 6,507,797 B1 | 1/2003 | Kliman et al. |
| 6,515,564 B2 | 2/2003 | Leopold et al. |
| 6,522,228 B2 | 2/2003 | Wellner et al. |
| 6,525,541 B1 | 2/2003 | Leopold |
| 6,532,139 B2 | 3/2003 | Kim et al. |
| 6,532,424 B1 | 3/2003 | Haun et al. |
| 6,538,862 B1 | 3/2003 | Mason, Jr. et al. |
| 6,542,056 B2 | 4/2003 | Nerstrom et al. |
| 6,567,250 B1 | 5/2003 | Haun et al. |
| 6,567,759 B2 | 5/2003 | Dollar, II |
| 6,570,392 B2 | 5/2003 | Macbeth et al. |
| 6,577,478 B2 | 6/2003 | Kim et al. |
| 6,577,484 B1 | 6/2003 | Macbeth et al. |
| 6,587,319 B1 | 7/2003 | Finlay, Sr. |
| 6,590,753 B1 | 7/2003 | Finlay |
| 6,590,754 B1 | 7/2003 | Macbeth |
| 6,594,125 B2 | 7/2003 | Dollar, II |
| 6,608,741 B1 | 8/2003 | Macbeth |
| 6,621,669 B1 | 9/2003 | Haun et al. |
| 6,625,550 B1 | 9/2003 | Scott et al. |
| 6,628,486 B1 | 9/2003 | Macbeth |
| 6,628,487 B1 | 9/2003 | Macbeth |
| 6,633,467 B2 | 10/2003 | Macbeth et al. |
| 6,633,824 B2 | 10/2003 | Dollar, II |
| 6,639,769 B2 | 10/2003 | Neiger et al. |
| 6,650,516 B2 | 11/2003 | Langford et al. |
| 6,654,219 B1 | 11/2003 | Romano et al. |
| 6,667,691 B2 | 12/2003 | Sapir |
| 6,674,289 B2 | 1/2004 | Macbeth |
| 6,677,743 B1 | 1/2004 | Coolidge et al. |
| 6,707,651 B2 | 3/2004 | Elms et al. |
| 6,720,872 B1 | 4/2004 | Engel et al. |
| 6,724,590 B1 | 4/2004 | Radosavljevic et al. |
| 6,724,591 B2 | 4/2004 | Clarey et al. |
| 6,731,483 B2 | 5/2004 | Mason, Jr. et al. |
| 6,734,682 B2 | 5/2004 | Tallman et al. |
| 6,744,254 B2 | 6/2004 | Clarey et al. |
| 6,744,260 B2 | 6/2004 | Schmalz et al. |
| 6,767,245 B2 | 7/2004 | King |
| 6,777,953 B2 | 8/2004 | Blades |
| 6,781,381 B2 | 8/2004 | Parker |
| 6,782,329 B2 | 8/2004 | Scott |
| 6,785,104 B2 | 8/2004 | Tallman et al. |
| 6,798,211 B1 | 9/2004 | Rockwell et al. |
| 6,798,628 B1 | 9/2004 | Macbeth |
| 6,807,035 B1 | 10/2004 | Baldwin et al. |
| 6,815,955 B1 | 11/2004 | O'Neal, III |
| 6,822,458 B2 | 11/2004 | Shander |
| 6,831,819 B2 | 12/2004 | Nemir et al. |
| 6,839,208 B2 | 1/2005 | Macbeth et al. |
| 6,850,072 B1 | 2/2005 | Stanisic |
| 6,850,073 B2 | 2/2005 | Elms et al. |
| 6,873,158 B2 | 3/2005 | Macbeth |
| 6,876,204 B2 | 4/2005 | Smith |
| 6,876,528 B2 | 4/2005 | Macbeth |
| 6,952,150 B2 | 10/2005 | Radosavljevic et al. |
| 6,958,895 B1 | 10/2005 | Radosavljevic et al. |
| 6,969,801 B2 | 11/2005 | Radosavljevic et al. |
| 6,972,572 B2 | 12/2005 | Mernyk et al. |
| 6,972,936 B2 | 12/2005 | Morris |
| 6,972,937 B1 | 12/2005 | Macbeth et al. |
| 6,980,005 B2 | 12/2005 | Finlay, Sr. et al. |
| 6,980,932 B2 | 12/2005 | Liu |
| 6,998,945 B2 | 2/2006 | Huang et al. |
| 7,003,435 B2 | 2/2006 | Kolker et al. |

(56) References Cited

U.S. PATENT DOCUMENTS

| | | |
|---|---|---|
| 7,009,406 B2 | 3/2006 | Naidu et al. |
| 7,016,172 B2 | 3/2006 | Escoda |
| 7,019,952 B2 | 3/2006 | Huang et al. |
| 7,038,897 B2 | 5/2006 | Csanky et al. |
| 7,057,401 B2 | 6/2006 | Blades |
| 7,061,252 B2 | 6/2006 | Bouton et al. |
| 7,062,388 B2 | 6/2006 | Rivers, Jr. et al. |
| 7,068,480 B2 | 6/2006 | Wong et al. |
| 7,068,481 B2 | 6/2006 | Radosavljevic et al. |
| 7,091,723 B2 * | 8/2006 | Simmons ........... G01R 31/3277 324/508 |
| 7,110,864 B2 | 9/2006 | Restrepo et al. |
| 7,133,267 B2 | 11/2006 | Potter |
| 7,136,265 B2 | 11/2006 | Wong et al. |
| 7,149,065 B2 | 12/2006 | Baldwin et al. |
| 7,151,656 B2 | 12/2006 | Dvorak et al. |
| 7,154,718 B1 | 12/2006 | Finlay, Sr. et al. |
| 7,161,780 B2 | 1/2007 | Germain et al. |
| 7,164,564 B1 | 1/2007 | Finlay, Sr. et al. |
| 7,170,405 B2 | 1/2007 | Daum et al. |
| 7,177,125 B2 | 2/2007 | Lazarovich et al. |
| 7,179,992 B1 | 2/2007 | Packard et al. |
| 7,180,299 B2 | 2/2007 | Mernyk et al. |
| 7,215,520 B2 | 5/2007 | Elms et al. |
| 7,224,558 B2 | 5/2007 | Chu |
| 7,239,491 B1 | 7/2007 | Morgan et al. |
| 7,242,291 B2 | 7/2007 | Nicolls et al. |
| 7,253,629 B1 | 8/2007 | Richards et al. |
| 7,253,640 B2 * | 8/2007 | Engel ................... H02H 1/0015 324/536 |
| 7,259,568 B2 | 8/2007 | Mernyk et al. |
| 7,268,558 B2 | 9/2007 | Mills et al. |
| 7,268,989 B2 | 9/2007 | Parker et al. |
| 7,295,410 B1 | 11/2007 | Packard et al. |
| 7,298,598 B1 | 11/2007 | Morgan et al. |
| 7,307,429 B1 | 12/2007 | Parker et al. |
| 7,312,963 B1 | 12/2007 | Radosavljevic et al. |
| 7,317,600 B2 | 1/2008 | Huang et al. |
| 7,319,574 B2 | 1/2008 | Engel |
| 7,345,489 B2 | 3/2008 | DeHaven |
| 7,359,167 B2 | 4/2008 | Elms |
| 7,359,168 B2 | 4/2008 | Elms et al. |
| 7,362,552 B2 | 4/2008 | Elms et al. |
| 7,362,553 B2 | 4/2008 | Elms et al. |
| 7,372,678 B2 | 5/2008 | DiSalvo et al. |
| 7,400,481 B2 | 7/2008 | Pellon et al. |
| 7,471,075 B2 | 12/2008 | Berland et al. |
| 7,652,566 B2 | 1/2010 | Lee et al. |
| 7,843,197 B2 | 11/2010 | Finlay, Sr. et al. |
| 7,872,464 B2 | 1/2011 | Berland et al. |
| 8,179,145 B2 | 5/2012 | Kinsel |
| 2002/0063565 A1 * | 5/2002 | Stroth ................ G01R 31/3277 324/536 |
| 2004/0100274 A1 | 5/2004 | Gloster et al. |
| 2005/0209802 A1 | 9/2005 | Taraci |
| 2005/0212505 A1 | 9/2005 | Murray et al. |
| 2006/0038573 A1 * | 2/2006 | Sarkozi ............. G01R 31/1272 324/536 |
| 2006/0125582 A1 | 6/2006 | Mills et al. |
| 2007/0008103 A1 | 1/2007 | Nicolls et al. |
| 2008/0036473 A1 * | 2/2008 | Jansson .............. G06F 3/03547 324/678 |
| 2008/0284450 A1 | 11/2008 | Lee et al. |
| 2009/0189615 A1 | 7/2009 | Kinsel |
| 2010/0073002 A1 | 3/2010 | Chan et al. |
| 2010/0103568 A1 | 4/2010 | Lee |
| 2011/0031984 A1 * | 2/2011 | Hashimoto ........ G01R 31/3004 324/678 |
| 2011/0141644 A1 | 6/2011 | Hastings |
| 2012/0319709 A1 * | 12/2012 | Brazis, Jr. .......... G01R 31/3272 324/750.01 |

FOREIGN PATENT DOCUMENTS

| | | |
|---|---|---|
| EP | 0961129 A1 | 12/1999 |
| TW | 401720 B | 8/2000 |
| TW | 200731633 | 8/2007 |

OTHER PUBLICATIONS

International Preliminary Report on Patentability for Application No. PCT/US2011/040611 dated Dec. 17, 2013.

Office Action in TW Application No. 101121416 dated Dec. 28, 2015, 6 pages.

* cited by examiner

HIGH SPEED CONTROLLABLE LOAD

CROSS-REFERENCE TO RELATED APPLICATION

This is a continuation of U.S. patent application Ser. No. 13/160,710, entitled "High Speed Controllable Load" and filed on Jun. 15, 2011, the entire disclosure of which is hereby incorporated herein by reference.

TECHNICAL FIELD

This patent is directed to generation of electrical waveforms. More specifically, this patent is directed to a high speed controllable load that may be used for testing arc fault circuit interrupters.

BACKGROUND

Ground fault circuit interrupters (GFCI) are well established in commercial and residential settings for shutting off electrical current when an imbalance of current occurs between the hot and neutral lines in a circuit. Another electrical protection device of growing interest is an arc fault circuit interrupter (AFCI). The AFCI detects arcing in an electrical circuit that may be caused by, among other things, a loose wire connection at an outlet, damaged electrical wires, or faulty wiring in an appliance. When the arcing condition is detected, the AFCI interrupts the circuit, providing some level of protection against the arcing developing into a fire.

Testing AFCIs falls into several general categories including end-of-line testing, self-testing, and performance testing. End-of-line testing is performed in a manufacturing process to confirm operation of the AFCI device. A tester in such an environment need only provide an arc or waveform that fits any characteristic of an arc fault such that it causes a properly functioning AFCI to open. Similarly, self-testing requires generating any single waveform that will trigger a functioning AFCI.

Performance testing, on the other hand, should test the AFCI over a wide range of arc fault conditions with good repeatability so that the design and implementation of an AFCI can be accurately characterized.

Most end-of-line testers and some performance testers use mechanical techniques to actually draw a physical arc using prepared samples of cable or other techniques. While this may be effective at providing a real-world arc, it neither provides a range of arc profiles nor provides a repeatable test environment for performance testing.

SUMMARY

One aspect of the present disclosure provides a high speed controllable load that uses a controllable electronic resistor and a control stage to allow repeatable generation of a full range of arcing profiles. An analog voltage waveform is used to drive the controllable electronic resistor to draw a desired amount of current through an AFCI device under test. The controllable electronic resistor is capable of sinking currents from zero to approximately 500 amps rms. In order to reproduce complex arc profiles, the control stage generating the analog voltage waveforms provides low distortion response for frequencies from around 1 Hz to above 100 MHz.

Output current and voltage sensors allow verification of waveforms. A zero crossing detector on the input voltage allows simulation of a wide range of reactive loads by timing resistance changes in the controllable electronic resistor with a zero crossing point in the source voltage. The high speed controllable load may use a multi-phase power source to simulate reactive loads requiring non-zero current at a source voltage zero crossing.

DETAILED DESCRIPTION

Although the following text sets forth a detailed description of numerous different embodiments, it should be understood that the legal scope of the description is defined by the words of the claims set forth at the end of this disclosure. The detailed description is to be construed as exemplary only and does not describe every possible embodiment since describing every possible embodiment would be impractical, if not impossible. Numerous alternative embodiments could be implemented, using either current technology or technology developed after the filing date of this patent, which would still fall within the scope of the claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term by limited, by implication or otherwise, to that single meaning. Finally, unless a claim element is defined by reciting the word "means" and a function without the recital of any structure, it is not intended that the scope of any claim element be interpreted based on the application of 35 U.S.C. §112, sixth paragraph.

Figure 1:
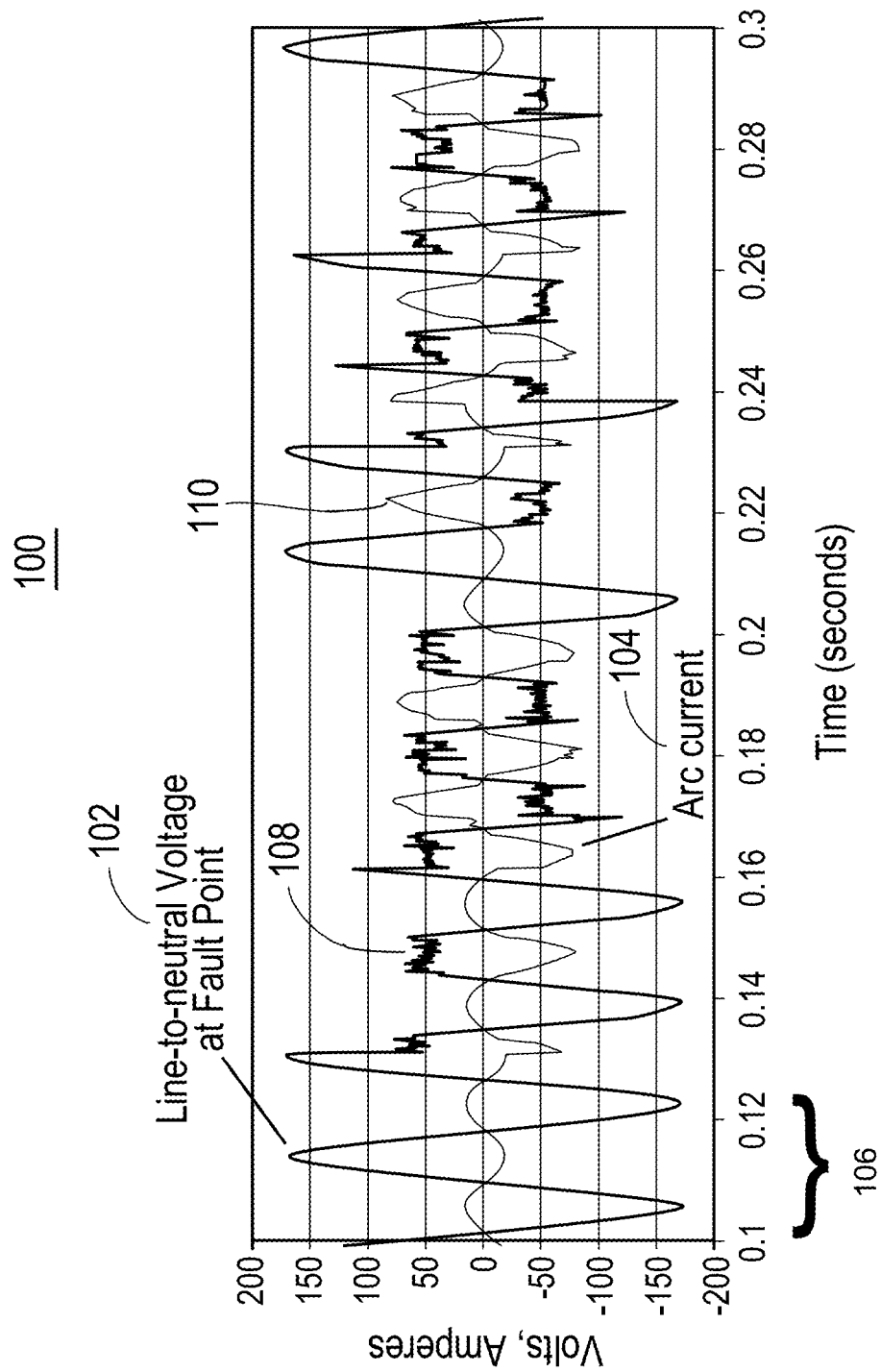
FIG. 1 shows an exemplary voltage and current associated with an exemplary arc fault.

FIG. 1 shows a voltage 102 and a current 104 associated with an exemplary arc fault 100. An initial portion 106 of the waveforms shows a nominal voltage and current prior to the arcing condition. During the arcing incident, typical signature elements include a clipped voltage with very high frequency components 108 and high current spikes 110.

Frequency Domain Considerations

Arcing introduces noise over a very wide bandwidth. Most AFCIs look for arcing in the high KHz range, but there is research suggesting that significant noise is present at even higher frequencies (e.g., over 1 MHz). Therefore, a characterization of waveforms in the frequency domain is necessary. Arcing events, however, are discontinuous in time; for example, arcing will commence only after the striking voltage is exceeded, and will extinguish itself once the voltage falls below a minimum value that is necessary to maintain the arc. Therefore, the wideband noise characteristic of an arc will only be observed during the timeframes when arcing is present, and will be absent during the times when the arc has extinguished itself.

This characteristic may be manifested in the "shoulders" in the current waveform 104, but these shoulders may also be produced by normal circuits, such as light dimmers, so this in itself is not enough evidence of an arc-fault. In addition to these periodic discontinuities in behavior, arcing events also may include transients or other non-periodic behavior. These characteristics frustrate any analysis that assumes periodic and continuous behavior, such as a single Fast Fourier Transform (FFT) of a waveform. This would result in errors due to the tendency for the FFT to average out transients and other discontinuities, and prevent further investigation of the nature of this discontinuous behavior. However, if general information on the spectrum of an arcing waveform is needed (i.e., to determine needed bandwidth for signal reproduction, or to evaluate statistical variation in arcing signals between waveforms), a simple FFT encompassing the entire waveform may be sufficient as long as it is remembered that the resulting spectrum is an average representation of the entire waveform.

Time-Domain Considerations

Though frequency-domain analysis of arcing can reveal considerable information on arcing events, time-domain analysis is also critical in the analysis of arcing. As arcing tends to extinguish and re-strike in relation to the phase of the supply voltage, considerable information is available only in the time domain. Efforts for arc modeling have been reported since the 1920s, with a comprehensive review of the evolution of arc modeling available in the literature. These models tended to become increasingly descriptive and complex as analysis tools evolved over the decades. Work by Kaufman and Page in 1960 introduced an arcing model assuming purely inductive loads and a constant arc voltage with an assumed value (140 V for a 277 V rms system). Later work added complex impedance models, then estimates of arc voltages as a function of arc current and gap width. Modern arc modeling is exemplified by the Matthews model (see J. H. Matthews, Introduction to the Design and Analysis of Building Electrical Systems, New York: Van Nostrand Reinhold, 1993), which is a generalized instantaneous arc model based on a resistive-inductive system. According to this model, an arcing fault in a complex circuit is described by the following differential equation:

$$V_{max}\sin\omega t = Ri_{arc} + L\frac{di_{arc}}{dt} + V_{arc}$$

The general solution for the arc current is:

$$i_{arc}(t) = \frac{V_{max}}{|Z|} \cdot \left[\sin(\omega t - \phi) - \frac{m}{\cos\phi} + \left(\frac{m}{\cos\phi} - \sin(\omega t_a - \phi)\right)e^{\frac{-\omega(t-t_a)}{\tan\phi}}\right]$$

where
$V_{max}$=Peak of sinusoidal supply voltage
$i_{arc}$=Instantaneous arc current
R=System load resistance
L=System load inductance
Z=System load impedance
ω=System frequency (radians/second)
φ=Impedance angle
$V_{arc}$=Arc voltage
t=Time
$t_{arc}$=Time that arc current begins to flow
m=Ratio of arc voltage to peak voltage (V arc/V max)

A number of arc testers use mechanical means to bring conductors into proximity in order to draw out an arc. While an AFCI that activates during this real-life arc meets a minimum criteria, such testing does nothing to characterize a range of arcing conditions nor does it allow testing of non-arcing loads that may cause false triggers in an AFCI, such as a vacuum cleaner or light dimmer, known as nuisance tripping.

Figure 2:
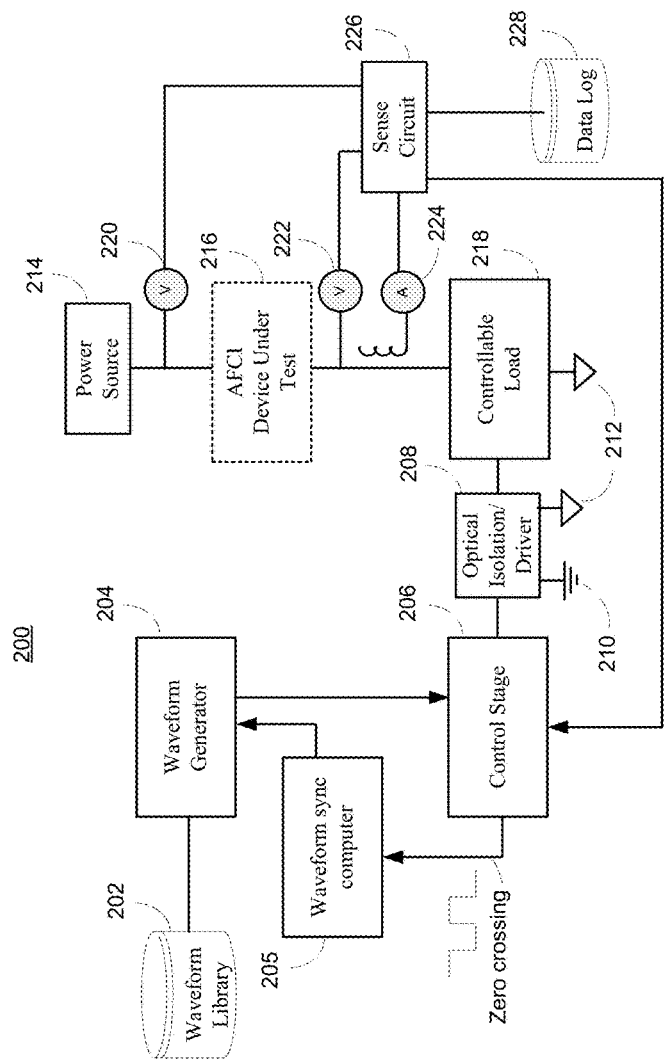
FIG. 2 is a block diagram of an arc fault tester.

FIG. 2 is a block diagram of an arc fault tester 200 constructed in accordance with the present disclosure and being capable of recreating a range of waveforms useful for verification of tripping in the presence of a simulated arc fault and verification of continued operation in a nuisance environment.

The arc fault tester 200 may include a waveform library 202 stored on a non-volatile storage mechanism, such as a hard disk or flash drive. The waveform library 202 may comprise arc fault and nuisance load waveforms corresponding to arc fault profiles and nuisance load profiles. Any number of waveform formats may be used to store the waveform. One exemplary format is the streaming TDM (TDMS) format developed by National Instruments Corporation for use with its Labview™ product.

A waveform generator 204 may be an off-the-shelf product capable of reproducing a waveform from a waveform file stored in the waveform library 202. A National Instruments PXI Platform installed in a computer or other waveform generator is suitable for this function.

A waveform synchronization computer 205 may be used to coordinate the timing of the waveform from the waveform generator 204 with a zero crossing of the test power. The waveform synchronization computer 205 may use an input from a control stage 206, such as a square wave with edges at a voltage zero crossing for use in triggering the waveform generator 204.

The control stage 206 may receive the waveform from the waveform generator 204. The control stage 206 may additionally compare a waveform at an AFCI device under test 216 to the waveform from the waveform generator 204 and generate an output signal based on the comparison, as will be described in more detail below. The control stage 206 may be implemented in discrete components or may be implemented via a digital signal processor (DSP) with a corresponding program stored in a non-volatile memory (not depicted).

The output of the control stage 206 may feed an optical isolation stage 208 that allows separation of a control stage ground 210 and a test apparatus ground 212. The optical isolation stage 208 may also include a driver circuit for the controllable load 218 that provides a slightly negative voltage to turn the controllable load FET devices fully off to a +12 V DC level to ensure the controllable load FET devices are fully turned on. While a test is in progress the test power is by the nature of the testing 'dirty,' so the optical isolation allows the control circuitry to operate from a clean power source. Alternatively, a wide range voltage output may directly drive the output stage with the floating ground referenced to the neutral of the test power.

A power source 214, referenced to the test apparatus ground 212, may be coupled to the AFCI device under test 216. Voltage sensors 220 and 222 and current sensor 224 may be coupled to a sense circuit 226 that provides signal outputs both to the control stage 206 and a test results data log 228. Of course, the arrangement of sensors and circuitry associated with coupling voltage and current information to the control stage 206 and waveform synchronization computer 205 is only one possible configuration. Other arrangements, including combining all the elements of the sense circuit 226 with the control stage, will be apparent to one of ordinary skill in the art. A supply connection of the power source 214 may be coupled to the AFCI device under test 216 and a return connection (not depicted) via the test apparatus ground 212 that completes the test circuit.

In operation, the control stage 206 takes voltage and current information from the power source 214 and AFCI device under test 216, via the sense circuitry 226, and uses this information provide information that triggers the waveform generator 204 at an appropriate start time and combines the signals to generate a drive signal for the controllable load 218.

During any series of tests, the AFCI device under test 216 may be presented with a variety of waveforms representing both normal and abnormal operating conditions with a high degree of repeatability so that uniform and consistent tests may be performed across devices and over a period of time.

Figure 3A:
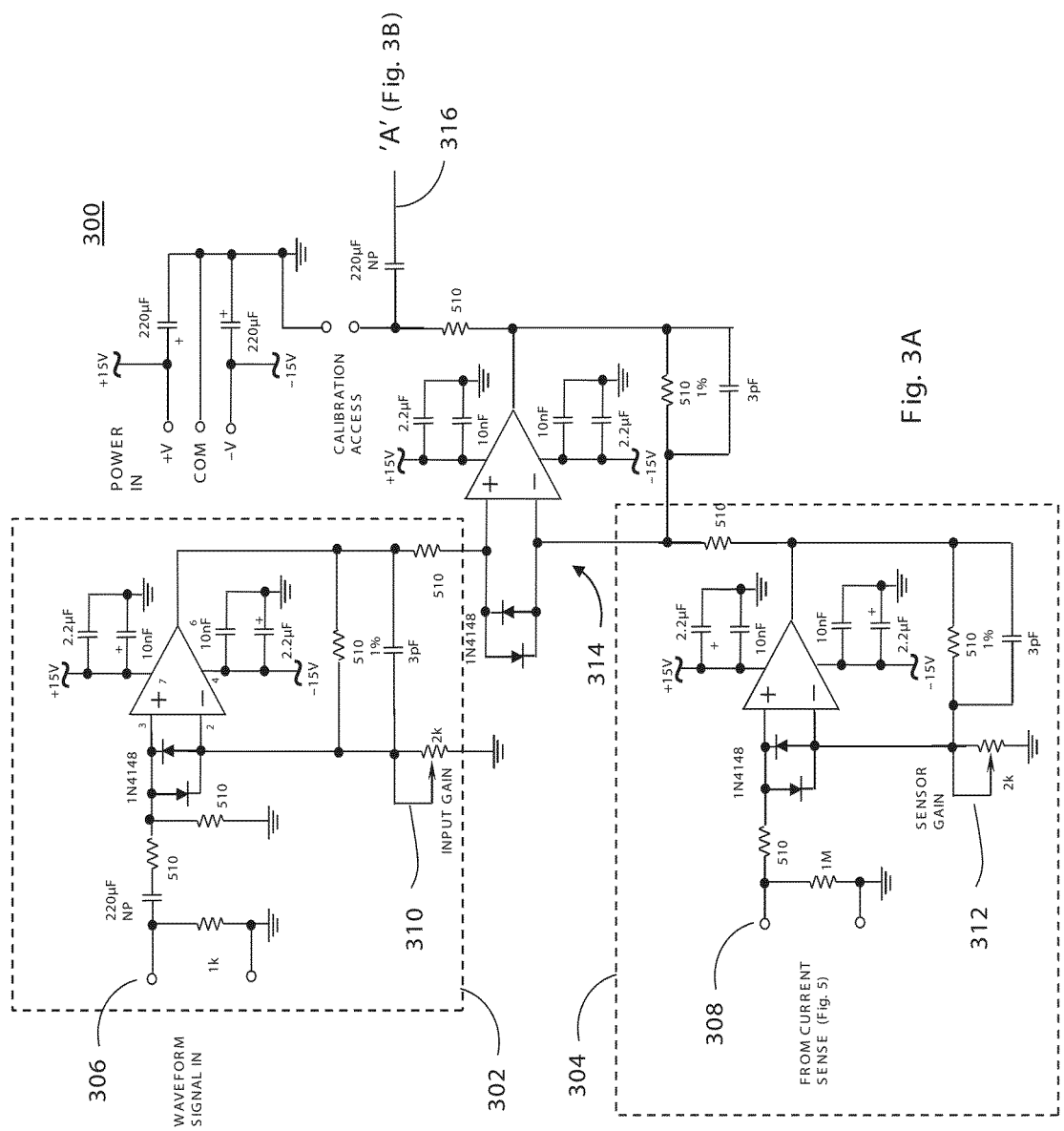
FIG. 3A is an exemplary circuit illustrating a portion of a control stage of the arc fault tester of FIG. 2.

FIG. 3A is an exemplary circuit illustrating a portion 300 of a control stage, such as, the control stage 206 of the arc fault tester 200 of FIG. 2.

The control stage portion 300 may include a waveform buffer/gain stage 302 and a current sense buffer/gain stage 304. Each circuit 302, 304 provides a respective high impedance input 306, 308 and a respective level adjustment 310, 312. A combiner circuit 314 combines the waveform and the current sense signal to provide a difference signal at output 316. The signal at point 316 represents the change in current at the controllable load 218 required to achieve the desired waveform at the AFCI device under test 216.

Figure 3B:
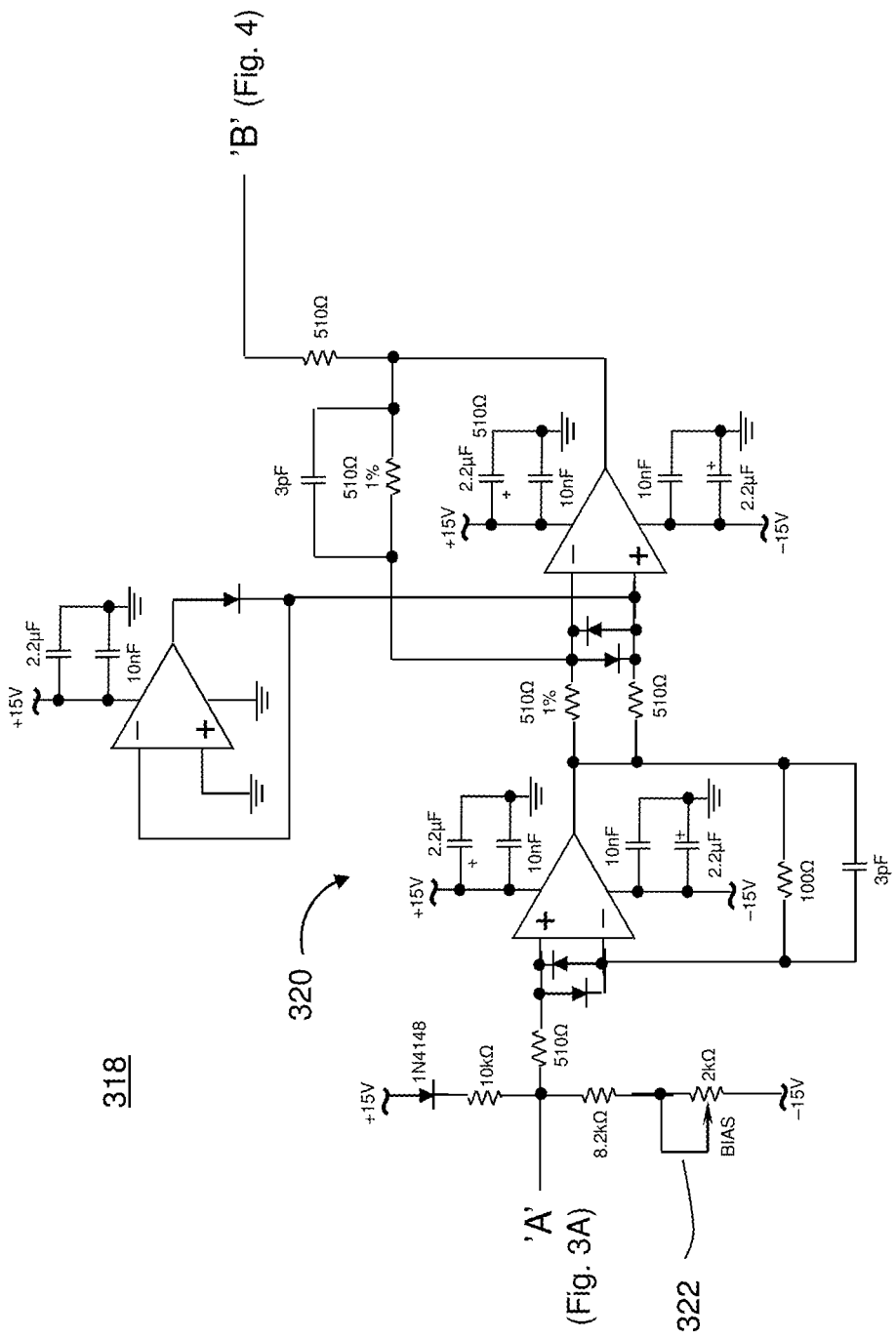
FIG. 3B is an exemplary circuit illustrating another portion of a control stage of the arc fault tester of FIG. 2.

FIG. 3B is an exemplary circuit illustrating another portion 318 of a control stage, such as the control stage 206 of the arc fault tester 200 of FIG. 2. The portion 318 may perform level shifting of the signal at point 316 of FIG. 3A ('A') using an level shifting circuit 320 and adjustment 322. The signal at 'B' may be provided to the optical isolation stage 208 when such a circuit is used.

In some embodiments, high speed operational amplifiers with bandwidths above 100 MHz may be included in the control stage 206 so that nuances of the test arc profile waveforms may be reproduced accurately.

Figure 3C:
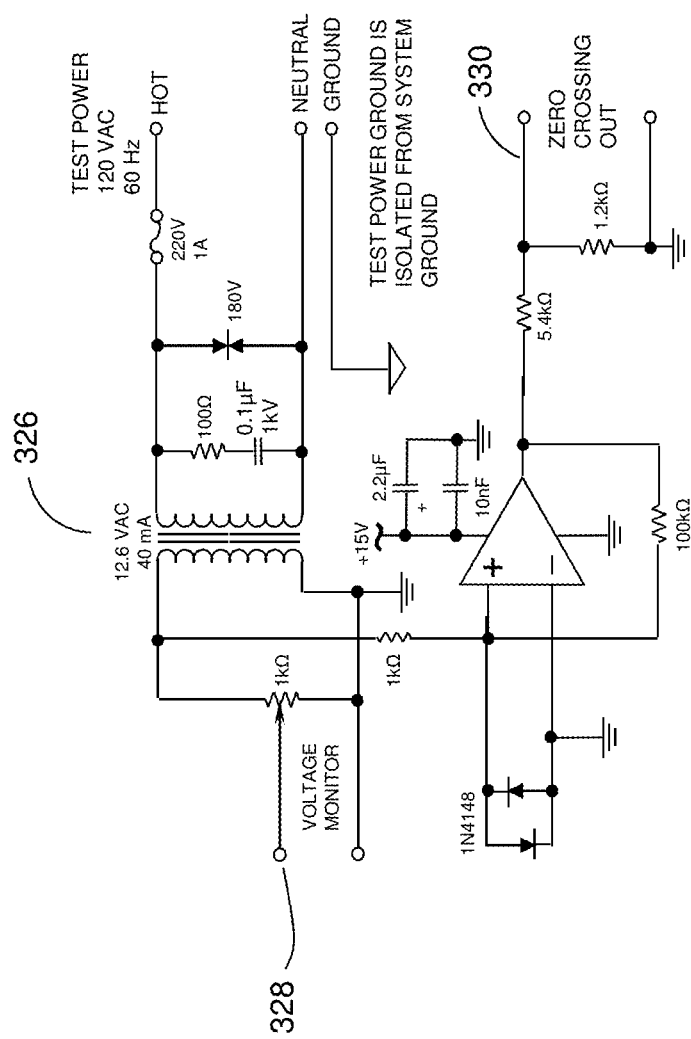
FIG. 3C is an exemplary circuit illustrating yet another portion of a control stage of the arc fault tester of FIG. 2.

FIG. 3C is an exemplary circuit illustrating yet another portion 324 of a control stage 206 of the arc fault tester 200 of FIG. 2. In some embodiments, some or all of this circuitry may be merged with the sense circuit 226. In this exemplary embodiment, a transformer 326 couples test power input voltage to a voltage monitor 328. The actual output voltage level may be adjusted in this embodiment. A square wave with transitions corresponding to test power voltage zero crossings may be provided at point 330 and used, for example, by the waveform synchronization computer 205 as described above.

Figure 4:
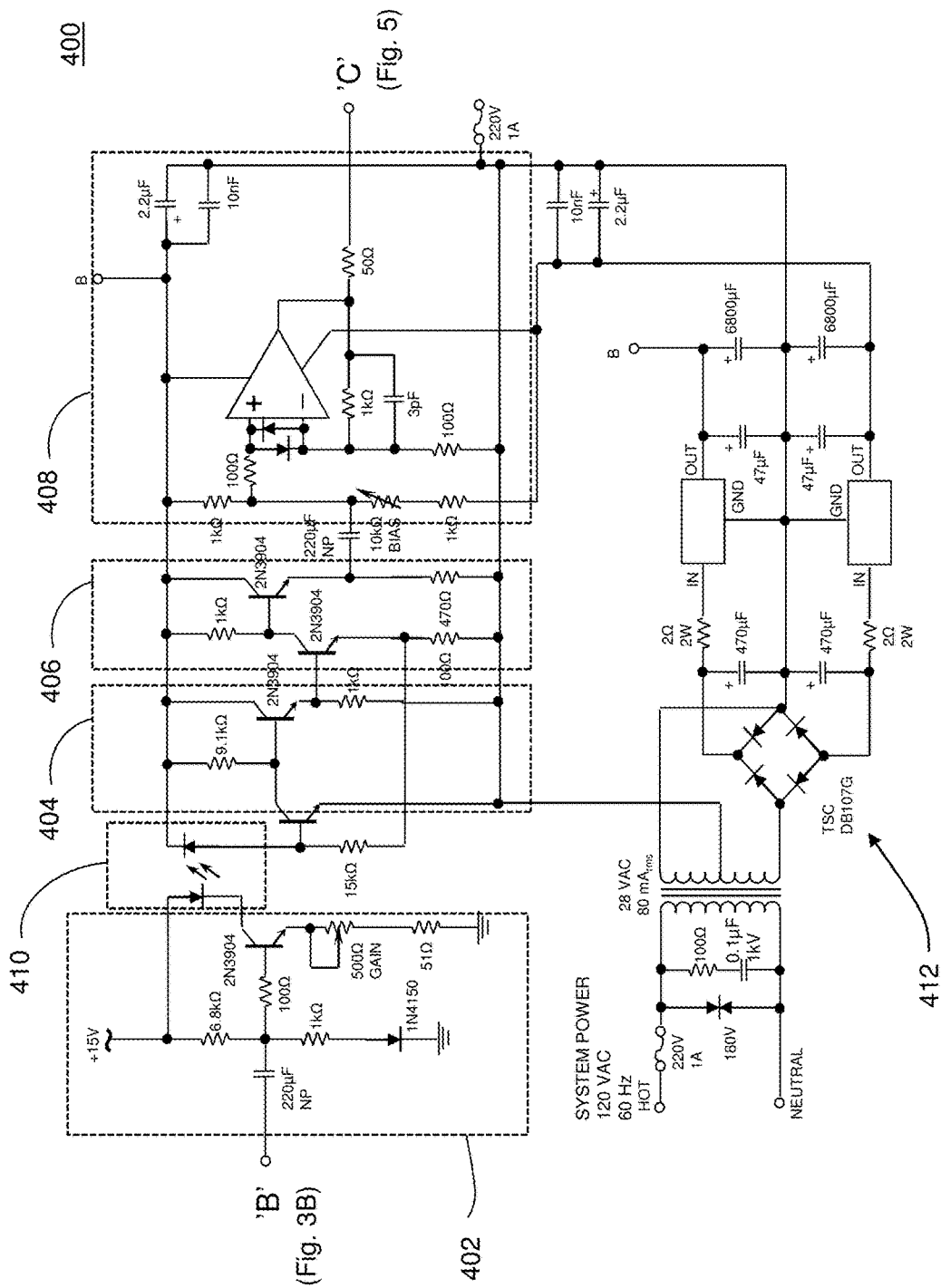
FIG. 4 an exemplary circuit of an isolation circuit of FIG. 2.

FIG. 4 is a representative and exemplary isolation circuit 400. The isolation circuit 400 may be used to pass signals while allowing separation of grounds, as shown by optical isolation stage 208 in FIG. 2. The exemplary isolation circuit 400 has an input stage 402, a pre-amplifier stage 404, a drive stage 406, and a power output stage 408. The input stage 402 and pre-amplifier stage 404 are signal coupled via an optical coupler 410. The optical coupler 410 provides accurate signal transmission while allowing the input stage 402 in the preamplifier stage 404 to operate off separate power supplies and use separate grounds.

The optical coupler solution allows a bandwidth of signals from less than 10 Hz to greater than 10 MHz, which would be difficult, if not impossible, to achieve using other isolation techniques, such as a transformer.

The ground reference at the power output stage 408 floats at about 60 VAC and can range between +/−120 V as the test side power supply 412 float on the power source 214 signal. The capacitor-coupled drive stage 406 allows the output to run slightly negative, as discussed above. The 10K ohm adjustable bias resistor allows the output to be shifted with respect to the test apparatus ground 212. Transistors in the input stage 402, pre-amplifier stage 404 and drive stage 406 may be 2N3904 transistor, in one embodiment.

Figure 5:
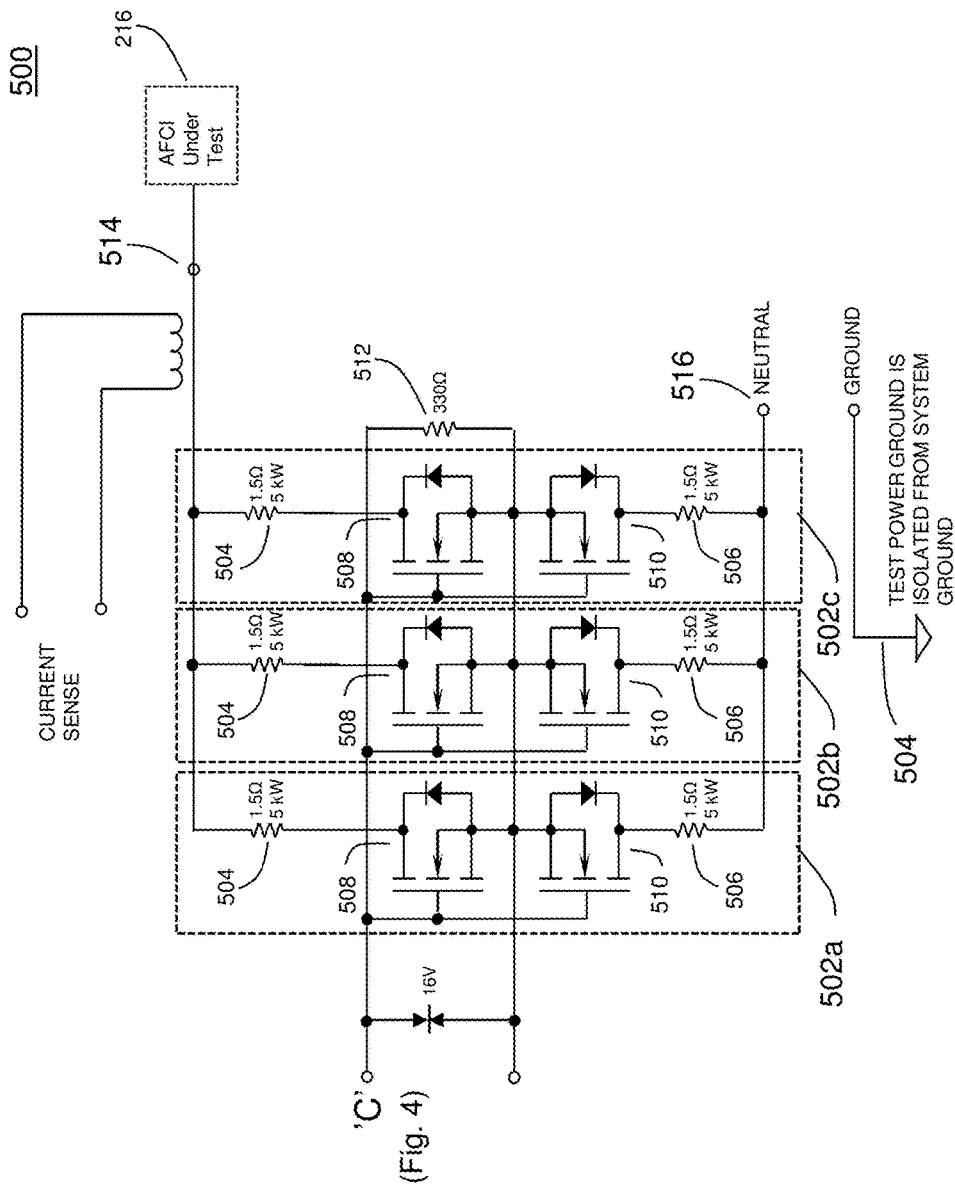
FIG. 5 is an exemplary circuit of a controllable load of FIG. 2.

FIG. 5 is one embodiment of a controllable load 500, such as the controllable load 218 in FIG. 2. The controllable load 500 may have one or more current stages 502. In the depicted example, the controllable load 218 includes three current stages 502a, 502b, 502c. Each current stage 502 may include one or more resistors 504, 506 and a pair of n-type FETs 508, 510. Because each current stage 502 may be required to pass currents up to 30 A or more. In the present example, when the FETs 508, 510 are fully on, each stage has a resistance of 3 ohms. The embodiment shown, with three current stages 502, the load presents an overall resistance of 1 ohm. Because of the extremely high current capability at each current stage 502, the 1.5 ohm resistors in this exemplary design are rated at 5 kW each. Should the current rating of the controllable load 500 need to be increased, additional current stages may be added that both increase the available current handling capability but also reduces the effective series resistance. In this exemplary embodiment, the FETs 508 and 510 may be IXFB 100N50P devices or an equivalent. The use of these or similar devices allow the controllable load to perform current changes in about 1 microsecond or less.

Resistor 512 speeds up the FETs by discharging the FET gate capacitance. For some FETs, this may not be required in order to reach desired switching times. The AFCI device under test 216 may be connected at terminal 514. Neutral connection 516 and ground connection 518 are isolated from system ground and power supplies via the isolation circuit 400. A current sensor 520 may be a toroid transformer and may be used for both feedback to the control stage 206 and for logging test data to the date log 228.

A wide range of phase angles between voltage and current can be accommodated by the simple adjustment of the resistance of the controllable load 500 at various points in the source voltage waveform. However, the single phase apparatus discussed above cannot simulate every possible reactive load because no current can be drawn through the AFCI when the source voltage is zero. A full range of reactive loads can be simulated by using a combination of controllable loads with phase-shifted sources.

Figure 6:
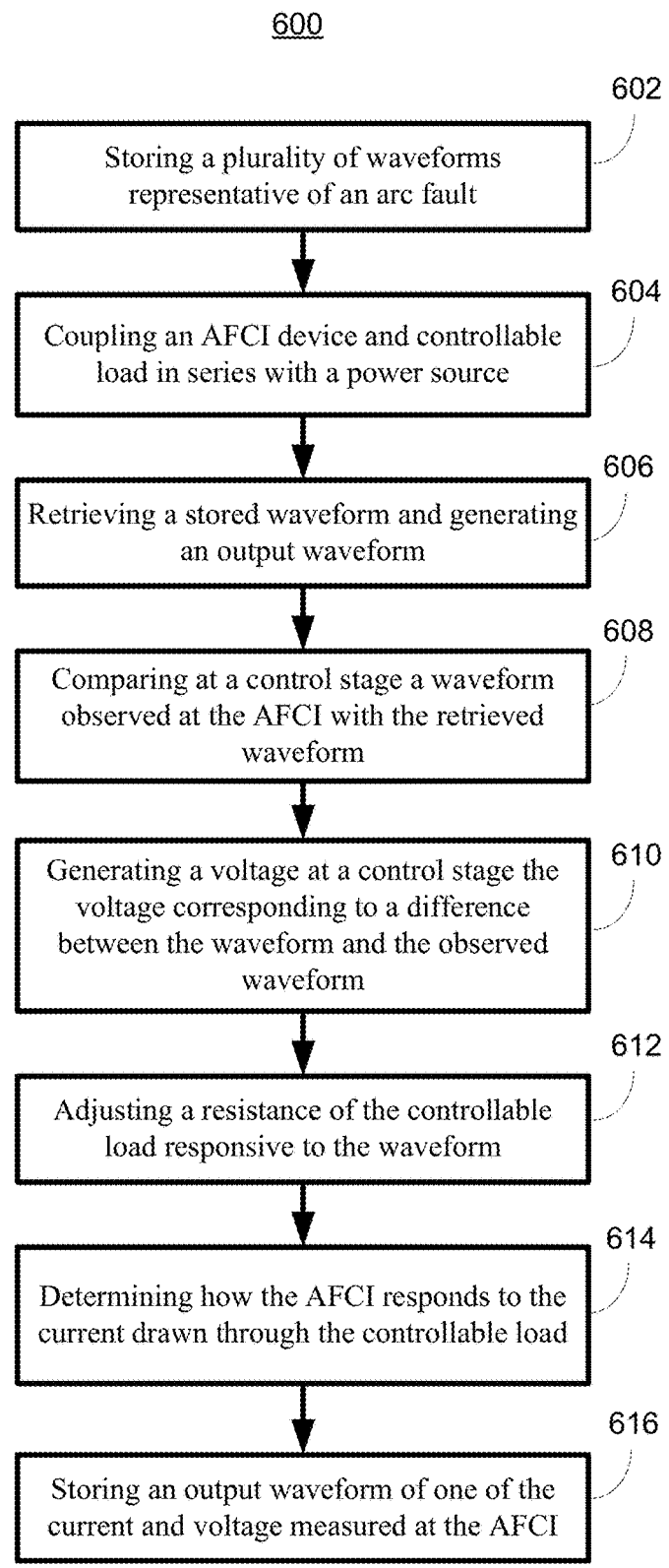
FIG. 6 is a flowchart of a method of testing an arc fault circuit interrupter.

FIG. 6 is a simplified and representative method 600 of testing an arc fault circuit interrupter (ACFI) 216 in accordance with the present disclosure.

A number of waveforms representative of both arc faults and nuisance faults may be generated. These waveforms may be stored in a waveform format, such as an TDMS format (block 602), a well known file format defined by National Instruments Corporation.

The AFCI 216 may be coupled in series with a controllable load 218 and a power source 214 (block 604).

A test sequence may be started by retrieving a particular waveform and generating an output waveform corresponding to the stored waveform (block 606).

The waveform may be converted to a control signal at the control stage 206 (shown in FIG. 2). At the beginning of the test, no feedback signals will be available from the device under test and the waveform will be used to set an initial resistance in the controllable load 218. After the test process has begun, a comparison may be made by the comparator 308 of the control stage 206 between the waveform and an observed waveform measured at the AFCI (block 608).

A voltage corresponding to the difference between the waveform and the observed waveform may be generated for use in adjusting a resistance in the controllable load 218 (block 610).

A resistance of the controllable load 218 may be adjusted responsive to the voltage to draw a current through the controllable load 218 and the AFCI 216 to replicate the waveform at the AFCI 216 (block 612).

After the test cycle, a determination may be made as to the correctness of the response of the AFCI 216 to the current drawn through the controllable load (block 614). Several outcomes are possible. For example, the AFCI 216 may correctly respond to an actual arc-fault and trip, incorrectly respond to an actual arc-fault and not trip, correctly respond to a nuisance waveform and not trip, or incorrectly respond to a nuisance load and trip, or may simply become inoperable.

An output waveform showing the waveform applied to the AFCI 216 may be stored for later verification or statistical analysis in the data log 228 (block 616).

The device and method disclosed represent a repeatable tester and test process for AFCI verification. Very high-current tests, up to 500 amps rms, with arc profile bandwidth components above 1 MHz and a range of reactive loads can be presented to AFCI devices under test. This is a particular advancement over mechanical testers that draw an actual arc for testing.

Although the foregoing text sets forth a detailed description of numerous different embodiments of the invention, it should be understood that the scope of the invention is defined by the words of the claims set forth at the end of this patent. The detailed description is to be construed as exemplary only and does not describe every possibly embodiment of the invention because describing every possible embodiment would be impractical, if not impossible. Numerous alternative embodiments could be implemented, using either current technology or technology developed after the filing date of this patent, which would still fall within the scope of the claims defining the invention.

Thus, many modifications and variations may be made in the techniques and structures described and illustrated herein without departing from the spirit and scope of the present invention. Accordingly, it should be understood that the methods and apparatus described herein are illustrative only and are not limiting upon the scope of the invention.

I claim:

1. A method of testing an arc fault circuit interrupter (AFCI) comprising:
    storing a waveform representative of an arc fault;
    coupling the AFCI and a controllable load in series with a power source;
    retrieving the stored waveform;
    sensing a current through the controllable load and the AFCI;
    adjusting a resistance in the controllable load based on the sensed current such that the current through the controllable load and the AFCI replicates the stored waveform at the AFCI.

2. The method of claim 1, wherein storing the waveform comprises:
    storing a plurality of waveforms representative of a corresponding plurality of arc faults.

3. The method of claim 2, further comprising:
    storing an output waveform of one of a voltage or current measured at the AFCI.

4. The method of claim 1, further comprising:
    determining whether the AFCI correctly responds to the current drawn through the controllable load.

5. A tester for an arc fault circuit interrupter (AFCI) comprising:
    a power source with a supply connection adapted to be coupled to a first AFCI connection of an AFCI and a return connection adapted to be coupled to a second AFCI connection of an AFCI;
    a controllable load with a first connection, a second connection, and a control connection, the first connection coupled to the second AFCI connection and the second connection coupled to the return connection of the power source;
    a waveform generator that reproduces waveforms indicative of an arc fault;
    a current sensor that senses current through the AFCI and the controllable load; and
    a control stage coupled to the waveform generator and to the control connection of the controllable load, wherein the control stage causes a resistance of the controllable load to change in response to (i) an output of the waveform generator, and (ii) the sensed current, such that a waveform generated by the waveform generator is replicated at the AFCI.

6. The tester of claim 5, further comprising:
    a voltage sensor to verify a phase angle between current and voltage at the AFCI.

7. The tester of claim 6, further comprising:
    a zero crossing detector to capture a zero crossing and polarity of a voltage of the power source.

8. The tester of claim 5, wherein the control stage comprises:
    an optical isolation stage that allows separation of an electrical ground of the power source from an electrical ground of the waveform generator.

9. The tester of claim 5, wherein the controllable load comprises:
    a high power resistor in series with at least one power field effect transistor (FET).

10. The tester of claim 9, wherein the at least one power FET comprises an array of N-channel power FETs.

11. The tester of claim 10, wherein the at least one power FET has a current rating of 100 amperes.

12. The tester of claim 5, wherein the control stage has an analog bandwidth of about 0.7 Hz to about 200 MHz.

13. The tester of claim 5, further comprising:
    a waveform library storing a plurality of waveforms indicative of a plurality of corresponding arc faults, and wherein the waveform generator reproduces waveforms indicative of the stored waveforms.

14. The tester of claim 13, wherein each stored waveform is stored as a streaming waveform file.

15. A method of testing an arc fault circuit interrupter (AFCI) comprising:

providing a waveform library with a plurality of stored waveforms, each of the plurality of stored waveforms representing a test condition for the AFCI;
providing a waveform generator in communication with the waveform library for generating one of the plurality of stored waveforms for performance testing of the AFCI;
providing a control stage coupled to the waveform generator, the control stage for outputting a control signal;
providing a controllable load that varies its resistance responsive to the control signal;
coupling an AFCI in series with the controllable load and a power source;
accepting the one of the plurality of stored waveforms at the control stage;
sensing a current through the controllable load and the AFCI;
creating the control signal at the control stage based on the one of the plurality of stored waveforms and the sensed current
adjusting a current through the controllable load and the AFCI proportionally to the control signal such that the current through the controllable load and the AFCI replicates the one of the plurality of stored waveforms; and
determining how the AFCI responds to a current through the controllable load and the AFCI as the resistance is adjusted.

16. The method of claim 15, further comprising:
passing the control signal through an optical isolation stage that separates a ground of the control stage and a ground of the controllable load.

17. The method of claim 15, wherein providing the controllable load comprises:
providing a controllable load with a current rating of at least 100 amperes and a response time for changing between two current levels of at most 1 microsecond.

18. The method of claim 15, further comprising:
determining that the AFCI interrupts current having an arc profile and passes current having a nuisance load profile.

19. The method of claim 1, further comprising:
generating a difference signal corresponding to a difference between (i) the retrieved waveform and (ii) an observed waveform generated using the sensed current, wherein adjusting the resistance in the controllable load includes adjusting the resistance using the difference signal.

20. The tester of claim 5, wherein the control stage comprises a circuit configured to generate a difference signal voltage corresponding to a difference between (i) a first voltage indicative of the sensed current, and (ii) a second voltage indicative of the waveform generated by the waveform generator.

* * * * *